(12) United States Patent
Wang

(10) Patent No.: US 10,847,204 B2
(45) Date of Patent: Nov. 24, 2020

(54) CONTROL OF REFRESH OPERATION FOR FIRST MEMORY REGION AT FIRST FREQUENCY AND FOR SECOND MEMORY REGION AT SECOND FREQUENCY

(71) Applicant: ARM Limited, Cambridge (GB)

(72) Inventor: Wei Wang, Cambridge (GB)

(73) Assignee: ARM LIMITED, Cambridge (GB)

( * ) Notice: Subject to any disclaimer, the term of this patent is extended or adjusted under 35 U.S.C. 154(b) by 30 days.

(21) Appl. No.: 15/886,970

(22) Filed: Feb. 2, 2018

(65) Prior Publication Data
US 2018/0286475 A1 Oct. 4, 2018

(30) Foreign Application Priority Data
Mar. 30, 2017 (GB) .................................. 1705134.3

(51) Int. Cl.
*G11C 11/406* (2006.01)
(52) U.S. Cl.
CPC .. *G11C 11/40615* (2013.01); *G11C 11/40622* (2013.01)
(58) Field of Classification Search
CPC ........ G11C 11/40615; G11C 11/40622; G11C 11/40618; G11C 11/406; G06F 13/1657; G06F 13/1636; G06F 11/10; G06F 1/3275
USPC ............ 711/106, 105; 365/106, 105, 185.25; 714/754
See application file for complete search history.

(56) References Cited

U.S. PATENT DOCUMENTS

| 6,094,705 | A | 7/2000 | Song |
| 7,233,538 | B1 * | 6/2007 | Wu ........................ G11C 11/406 365/222 |
| 8,295,115 | B2 * | 10/2012 | Kim .................. G11C 11/40615 365/222 |
| 9,384,820 | B1 | 7/2016 | Parik et al. |
| 2003/0056067 | A1 | 3/2003 | Lawrence |

(Continued)

FOREIGN PATENT DOCUMENTS

CN 105810235 7/2016

OTHER PUBLICATIONS

Combined Search and Examination Report for GB 1705134.3 dated May 31, 2017, 10 pages.
(Continued)

*Primary Examiner* — Hong C Kim
(74) *Attorney, Agent, or Firm* — Nixon & Vanderhye PC

(57) ABSTRACT

An apparatus comprises first and second memory regions each to store data using a data storage technology for which retention of data for longer than a predetermined period of time is dependent on a refresh operation for refreshing data in the memory region being performed at a frequency that is greater than or equal to a minimum refresh frequency. The apparatus further comprises at least one controller to control storage of data in the first memory region with the refresh operation performed at a first frequency lower than said minimum refresh frequency when valid data is stored in the first memory region, and to control storage of data in the second memory region with the refresh operation performed at a second frequency that is greater than or equal to said minimum refresh frequency. The at least one controller is configured to communicate with the first memory region via a first memory channel and with the second memory region via a second memory channel.

17 Claims, 5 Drawing Sheets

(56) References Cited

U.S. PATENT DOCUMENTS

| | | |
|---|---|---|
| 2003/0217246 A1 | 11/2003 | Kubota et al. |
| 2004/0233706 A1* | 11/2004 | Burgan .................. G11C 11/406 365/154 |
| 2006/0146630 A1* | 7/2006 | Sohn ..................... G11C 11/406 365/222 |
| 2007/0106860 A1* | 5/2007 | Foster, Sr. ............ G06F 1/3225 711/170 |
| 2008/0092016 A1 | 4/2008 | Pawlowski |
| 2009/0144506 A1* | 6/2009 | Barth, Jr. ............ G06F 12/0893 711/129 |
| 2011/0131371 A1* | 6/2011 | Sun ....................... G11C 11/406 711/106 |
| 2011/0296095 A1 | 12/2011 | Su et al. |
| 2012/0300568 A1 | 11/2012 | Park et al. |
| 2013/0033950 A1* | 2/2013 | Yeh ....................... G11C 11/406 365/222 |
| 2013/0176804 A1 | 7/2013 | Lee |
| 2015/0016204 A1* | 1/2015 | Dong ................ G11C 11/40618 365/222 |
| 2016/0180919 A1 | 6/2016 | Lee |
| 2017/0091087 A1* | 3/2017 | Cui ....................... G06F 3/0659 |
| 2017/0148504 A1* | 5/2017 | Saifuddin ............ G11C 7/1072 |

OTHER PUBLICATIONS

Jung, M. et al. "Omitting Refresh: A Case Study for Commodity and Wide I/O DRAMs." MEMSYS, Oct. 5-8, 2015, 7 pages.

Liu, J. et al. "RAIDR: Retention-Aware Intelligent DRAM Refresh" International Symposium on Computer Architecture, Jun. 2012, 13 pages.

Liu, S. et al. "Flikker Saving DRAM Refresh-power through Critical Data Partitioning" ASPLOS, Mar. 5-11, 2011, 12 pages.

Qureshi, M. et al. "AVATAR: A Variable-Retention-Time (VRT) Aware Refresh for DRAM Systems" IEEE/IFIP International Conference on Dependable Systems and Networks, Jun. 2015, 12 pages.

Smullen, C. et al. "Relaxing Non-Volatility for Fast and Energy-Efficient STT-RAM Caches" IEEE 17th International Symposium on High Performance Computer Architecture, Feb. 12-16, 2011, 12 pages.

* cited by examiner

CONTROL OF REFRESH OPERATION FOR FIRST MEMORY REGION AT FIRST FREQUENCY AND FOR SECOND MEMORY REGION AT SECOND FREQUENCY

This application claims priority to GB Patent Application No. 1705134.3 filed Mar. 30, 2017, the entire content of which is hereby incorporated by reference.

BACKGROUND

Technical Field

The present technique relates to control of refresh operation for memory regions.

Technical Background

Some data storage technologies may require a refresh operation to be performed in order to retain data for longer than a predetermined period of time.

SUMMARY

In a first example, the present technique provides apparatus comprising:

first and second memory regions each to store data using a data storage technology for which retention of data for longer than a predetermined period of time is dependent on a refresh operation for refreshing data in the memory region being performed at a frequency that is greater than or equal to a minimum refresh frequency; and at least one controller to control storage of data in the first memory region with the refresh operation performed at a first frequency lower than said minimum refresh frequency when valid data is stored in the first memory region, and to control storage of data in the second memory region with the refresh operation performed at a second frequency that is greater than or equal to said minimum refresh frequency when valid data is stored in the second memory region:

wherein said at least one controller is configured to communicate with the first memory region via a first memory channel and with the second memory region via a second memory channel.

In a second example, the present technique provides a method for an apparatus comprising first and second memory regions each to store data using a data storage technology for which retention of data for longer than a predetermined period of time is dependent on a refresh operation for refreshing data in the memory region being performed at a frequency that is greater than or equal to a minimum refresh frequency, said method comprising:

performing the refresh operation for the first memory region at a first frequency lower than said minimum refresh frequency when valid data is stored in the first memory region, and performing the refresh operation for the second memory region at a second frequency that is greater than or equal to said minimum refresh frequency when valid data is stored in the second memory region;

wherein at least one controller for controlling storage of data in the first and second memory regions communicates with the first memory region via a first memory channel and with the second memory region via a second memory channel.

In a third example, the present technique provides an apparatus comprising:

first and second memory regions each to store data using a data storage technology for which retention of data for longer than a predetermined period of time is dependent on a refresh operation for refreshing data in the memory region being performed at a frequency that is greater than or equal to a minimum refresh frequency; and at least one controller to control storage of data in the first memory region with the refresh operation performed at a first frequency lower than said minimum refresh frequency when valid data is stored in the first memory region, and to control storage of data in the second memory region with the refresh operation performed at a second frequency that is greater than or equal to said minimum refresh frequency when valid data is stored in the second memory region;

circuitry configured to trigger saving of at least a subset of data stored in said first memory region to said second memory region in response to one of an exception condition, an interrupt, and a context switch.

In a fourth example, the present technique provides an apparatus comprising:

at least one controller to control storage of data to a first memory region and a second region for storing data using a data storage technology for which retention of data for longer than a predetermined period of time is dependent on a refresh operation for refreshing data in the memory region being performed at a frequency that is greater than or equal to a minimum refresh frequency;

wherein the at least one controller is configured to control storage of data in the first memory region with the refresh operation performed at a first frequency lower than said minimum refresh frequency when valid data is stored in the first memory region, and to control storage of data in the second memory region with the refresh operation performed at a second frequency that is greater than or equal to said minimum refresh frequency when valid data is stored in the second memory region.

DESCRIPTION OF EXAMPLES

Figure 1:
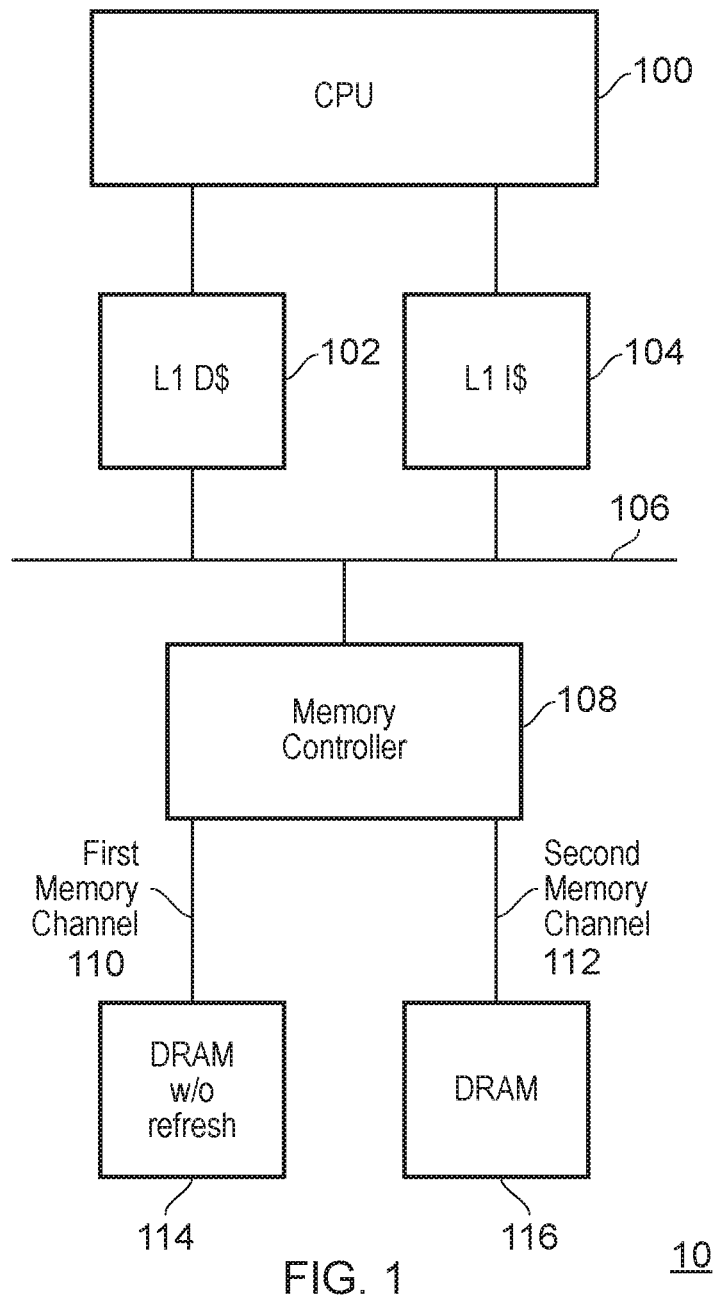
FIG. 1 shows one example of an apparatus according to the present technique.

An apparatus to store data may comprise memory regions using data storage technology that requires a refresh operation to be performed for data retention beyond a predetermined period. That is, when a refresh operation is performed at a frequency that is greater than or equal to a minimum refresh frequency, data is retained beyond the predetermined period, and when the refresh operation is performed at a frequency that is less than the minimum refresh frequency, data may not be retained beyond the predetermined period. However, certain valid data may not be required for the apparatus to perform processing at a point in time beyond the predetermined period. Therefore, in order to reduce power consumption, the present technique comprises a first memory region where the refresh operation is performed at a frequency that is lower than the minimum refresh frequency when valid data is stored in the first memory region. It can be assumed that the loss of valid data after the predetermined period will not have an impact on processing if it is expected that the apparatus will have no need to use this data once the predetermined period has elapsed. Therefore omitting the refresh operation for the first memory region when such valid data is stored reduces an otherwise unnecessary expenditure of power. The apparatus also comprises a second memory region, with the refresh operation performed at a second frequency that is greater than or equal to the minimum refresh frequency so that other data that may be required beyond the predetermined period can be stored in the second memory region. At least one controller is provided to communicate with the first memory region via a first memory channel and with the second memory region via a second memory channel. This can simplify the hardware implementation as it is simpler to manage the different refresh frequencies in the different regions on separate channels and this may allow greater reuse of existing memory controller or storage hardware designed without support for varying the refresh frequency in different regions of the memory.

In some examples, the first frequency may be non-zero, so that while some refreshing is still performed for the first region, refresh operations are performed at a lower frequency than the minimum refresh frequency.

However, in other examples the first frequency is zero. This reduces the power consumption of the apparatus because no power is incurred on performing any refresh operations for the first memory region.

In some examples, the apparatus comprises circuitry configured to trigger saving of at least a subset of data stored in said first memory region to said second memory region in response to one of an exception condition, an interrupt, and a context switch. The circuitry could be the at least one controller itself, or could be processing circuitry or some other element of the apparatus, which could trigger the saving in software or by a hardware detection mechanism. When one of these events occurs, processing switches from a current task to another task, and so the assumption that data stored in the first memory region will no longer be required beyond the predetermined period cannot be safely maintained, because this assumption is made on the basis that the current task will be completed without switching. That is, the exception, interrupt or context switch effectively may prolong the period between data of the suspended task being written and being read, so that it may still be required even after the predetermined period. Therefore, at least a subset of the data stored in the first memory region is stored in the second memory region so that it can be accessed when processing returns to the original task, which may occur after the predetermined period has elapsed. It is not always necessary to save all the data from the first memory region to the second memory region in response to such an event.

In some examples the at least one controller comprises a first controller configured to communicate with the first memory region via the first memory channel to control storage of data in the first memory region with the refresh operation performed at the first frequency, and a second controller configured to communicate with the second memory region via the second memory channel to control storage of data in the second memory region with the refresh operation performed at said second frequency. This arrangement further simplifies the implementation of the present technique because configuring two separate memory controllers in this manner requires less input from a designer than configuring one separate memory controller to control storage in both the first and second memory regions. For example, each of the first and second controllers could be an off-the-shelf controller designed for applying the same refresh frequency across an entire region of memory, with the first and second controllers could then be configured with different refresh frequencies. Alternatively, one of the controllers could be a controller designed for use with a memory technology that does not require refreshing and the other could be a controller designed for use with a memory technology that does require refreshing.

Nevertheless, other examples may use a single controller to control both the first and second memory channels.

In some examples the at least one controller is configured to provide a sequence of refresh addresses for controlling performance of said refresh operation on said second memory region. Therefore, in this arrangement the at least one controller is responsible for the refresh operation so a wider variety of memories may be used as the first and second memory regions since the first and second memory regions do not require any particular features for controlling refresh operations.

In some examples, a memory unit comprising said first memory region comprises refresh circuitry configured to perform said refresh operation, wherein said at least one controller is configured to control said refresh circuitry to perform said refresh operation at said first frequency for said first memory region. In this arrangement the at least one memory controller need not be responsible for controlling performance of the refresh operations, thus simplifying the design requirements of the at least one memory controller. Furthermore, a second memory unit comprising said second memory region may not comprise refresh circuitry, thus also simplifying the design requirements of the second memory unit. Alternatively, if the second memory unit does comprise refresh circuitry, this can be disabled by the at least one memory controller, e.g. the memory controller may output a signal specifying whether the refresh circuitry of the second memory unit is enabled or disabled.

In some examples the at least one controller is configured to identify occupied regions within the second memory region, and to control whether the second refresh operation is performed on the second memory region in dependence on whether the second memory region comprises any occupied regions. Therefore, a further reduction to power consumption can be achieved because the at least one controller may be arranged to control performance of the refresh operation on the basis of occupied regions of the second memory region. In some examples, the at least one controller is configured to omit performance of the refresh operation for unoccupied regions in the second memory region. Therefore, a reduction to power consumption can be achieved because power is not expended on refreshing unoccupied regions in the second memory region. Whereas this approach for the second memory region may result in the refresh frequency being less than the minimum refresh frequency for unoccupied regions without valid data, when valid data is stored then those occupied regions would be refreshed at a rate greater than the minimum refresh frequency. In contrast, for the first memory region the refresh frequency is less than the minimum refresh frequency even when valid data is stored.

In some examples, the apparatus comprises a third memory region to store data using the data storage technique, wherein the at least one controller is configured to control storage of data in the third memory region with the refresh operation performed at a third frequency greater than the second frequency. This improves reliability as more critical data may be stored in the third region where it is more secure by virtue of the higher refresh frequency. For example, the predetermined period may be temperature dependent, and regions of memory expected to be exposed to higher temperatures could be refreshed at a higher rate to guard against loss of data (e.g. in a 3D stacked integrated circuit some regions of memory could be at higher temperatures). The third region may also be less vulnerable to malicious activities such as row-hammer attacks (for example if the memory technology uses capacitors to store the data, by refreshing the third memory region at a greater frequency, the charge of the capacitors drops less between successive refreshes and so the capacitors of the third memory region are less influenced by any leakage from neighbouring rows, which may occur in a row hammer attack in an attempt to corrupt data in a memory region).

In some examples, the data storage technology comprises DRAM (dynamic random access memory). This data storage technology is particularly suitable for the present technique in view of its low cost and wide availability. However, other data storage technologies are also suitable. For example, the present technique may be used in conjunction with any data storage technology such as magnetic RAM (MRAM), ferroelectric RAM (FRAM), phase change memory (PCM), spin-transfer torque ram (STT-RAM), resistive RAM (ReRAM) and memristors for example. As mentioned below, even memory technologies which would generally be considered non-volatile and so would not require refreshing can be made effectively volatile by varying design parameters, so the present technique can still be used.

In some examples, the first and second memory regions comprise separate memory units. In such an arrangement with two separate memory units each communicating with a memory controller via two separate channels, the control of the refresh operations can be implemented in the memory controller in a more straightforward manner. This allows a designer to incorporate memory regions of their choice to the apparatus, thus providing more flexibility and simplicity in implementing the present technique. For example, standard 'off-the-shelf' memory units can be used if the refresh control is in the memory controller, or alternatively the different refresh frequencies in the first/second regions can be implemented without any awareness from either the memory unit or the memory controller by selecting a pair of memory controller/memory unit on the first channel which uses a lower refresh frequency than the pair of memory controller/memory unit on the second channel.

In some examples, the first and second memory regions comprise separate dual in-line memory modules (DIMMs). Manufacturing an apparatus according to this arrangement is relatively simple as the present technique can be performed by the memory controller, whilst additional features of the memory regions other than those native to the DIMMs are not required.

In some examples the first frequency may be variable in dependence on an error rate detected for the first memory region. For example, the apparatus may include an error detection mechanism, which allows errors in stored values to be detected. For example, data stored in the first memory region may be associated with error detecting codes or error correcting codes which allow errors caused by at least one bit changing state to be detected (in the case of error detecting codes such as parity codes), or corrected (in the case of error correcting codes such as convolution codes or block codes). The minimum refresh frequency for a given memory technology may be defined according to the worst case memory cell expected, but manufacturing process variation may mean that some memory cells may store data for longer even if not refreshed at the minimum rate. The provision of an error detection mechanism may mean that the system can tolerate a certain number of errors. The error detection rate may be an indication of whether the first frequency is too low (causing too many errors), or higher than it needs to be so that further power savings could be achieved by reducing the first frequency further (if relatively few errors are detected). Counter-intuitively, the preferred point for setting the first frequency could in fact corresponding to a non-zero error detection rate, in order to save energy by avoiding performing as many refresh cycles in a given time period. Hence, the memory controller or some circuitry within the memory storage module could vary the first frequency in dependence on a comparison between the error detection rate and a threshold, increasing the first frequency if the error detection rate is greater than the threshold, and decreasing the second frequency if the error detection rate is lower than the threshold. The threshold can be non-zero. The first frequency can be adjusted to a level which corresponds to (or just above) the error rate which can be handled by the error detection mechanism.

In some examples, the memory regions could be off-chip memory. Hence, an apparatus may comprise at least one controller to control storage of data to a first memory region and a second region for storing data using a data storage technology for which retention of data for longer than a predetermined period of time is dependent on a refresh operation for refreshing data in the memory region being performed at a frequency that is greater than or equal to a minimum refresh frequency;
wherein the at least one controller is configured to control storage of data in the first memory region with the refresh operation performed at a first frequency lower than said minimum refresh frequency when valid data is stored in the first memory region, and to control storage of data in the second memory region with the refresh operation performed at a second frequency that is greater than or equal to said minimum refresh frequency when valid data is stored in the second memory region. Hence, the apparatus need not comprise the first and second memory regions themselves.

FIG. 1 shows one example of an apparatus 10 according to the present technique. The apparatus comprises a central processing unit (CPU) 100, which is coupled to a level 1 data cache (L1D$) 102 and a level 1 instruction cache (L1I$). The caches are coupled to memory controller 108 via data bus 106. The memory control 108 is coupled to a DRAM without refresh 114 via a first memory channel 110 and a DRAM 116 via a second memory channel 112. Thus the memory hierarchy of the apparatus 10 includes a single level of caches comprising L1D$ 102 and L1I$ 104 and a single level of main memory comprising the DRAM without refresh 114 and the DRAM 116. However, it will be appreciated that other memory hierarchies, comprising multiple layers of caches and main memory elements may also be implemented according to the present technique.

Both the DRAM without refresh 114 and DRAM 116 are volatile memories, and require periodic refresh operations to be performed if data is to be retained. DRAM memory technologies store data in capacitors, with a charged capacitor representing a binary '1' and a discharged capacitor representing binary '0' for example. However, the capacitors discharge over time, typically within milliseconds (the exact retention period depends on the implementation). To avoid the loss of data stored in a DRAM, the data is read from the DRAM and rewritten, thus restoring the charge in the relevant capacitors. Such an operation is known as a refresh operation and may be controlled by the memory controller 108, or the DRAMs themselves. A given DRAM circuit typically is defined with a certain minimum refresh frequency such that if a refresh operation is not performed at that frequency, the capacitors may have discharged and so the data in the DRAM cannot be guaranteed to remain. Hence, storage of data for longer than a predetermined period may depend on the refresh operation being performed at a frequency greater or equal to the minimum refresh frequency.

The apparatus 10 of FIG. 1 provides the storage capacity of two DRAM units, DRAM without refresh 114 and DRAM 116, but operates at a lower level of power consumption since power is not expended on performing refresh operations for the DRAM without refresh 114. However, as no refresh operations are performed, the DRAM without refresh 114 may not be guaranteed to store data beyond the predetermined period. Therefore, DRAM without refresh 114 should not be used to store any data which is expected to be required for proper processing at a point beyond the predetermined period from when the data is first stored in the DRAM without refresh 114. However, there are types of data which if lost after the predetermined period will not have an adverse effect of the apparatus. For example, in a frame buffer of a graphics processing unit (GPU), one can safely assume that any frames stored to the buffer will be used within the predetermined period. Furthermore, other types of data that may be required after the predetermined period may also be suitable candidates for storage in the DRAM without refresh 114, such as data items which if incorrect do not have a noticeable impact on processing. For example, the binary elements of randomised algorithms and fault tolerant channel coding algorithms such as LDPC may not impact processing should these elements be lost in absence of a refresh operation. Therefore, the DRAM without refresh is suitable for storing such data, and the reduction in power consumption provided by omitting the refresh comes at no cost as the data stored in the DRAM without refresh 114 is not required for proper processing beyond the predetermined period. In addition, the DRAM without refresh 114 can also be used to provide security and/or privacy for suitable types of sensitive data, whilst reducing the processing required of the apparatus 10. For example, sensitive data may be stored in DRAM 116 and then subsequently be erased when it is no longer required. Erasing the sensitive data maintains security and/or privacy. However, this requires the apparatus 10 to execute an erasing process, which consumes processing resources. Therefore, to relieve this requirement, the sensitive data may instead be stored in the DRAM without refresh 114. At a point beyond the predetermined period the sensitive data will be lost from the DRAM without refresh 114 without an erasing process having been performed by the apparatus 10, thus reducing the number of processing operations required of the apparatus 10. Hence, the non-persistent memory region can offer inherent security/privacy of data.

The DRAM without refresh 114 and the DRAM 116 are addressed by first memory channel 110 and second memory channel 112 respectively. As can be seen in FIG. 1, the first memory channel 110 and the second memory channel 112 are separate signal lines within the apparatus (e.g. separate buses or separate sub-portions of a common bus). This arrangement allows for different signals to be transmitted via each memory channel in parallel. The use of separate memory channels in this manner is advantageous because standard "off the shelf" DRAM may be used as DRAM without refresh 114 and DRAM 116, and each DRAM can be controlled independently via the separate memory channels to either perform, or to not perform, refresh operations as appropriate.

It will be appreciated that although the example shown in FIG. 1 comprises DRAM memory technology, other memory technologies may also be used in conjunction with the apparatus, including volatile and non-volatile technologies. For example, whilst non-volatile memory regions typically have a retention time of months or even years, variations to design parameters of the memory technology may be made which reduce this. These variations may include reducing the planar area of a memory cell in order to reduce write current. This achieves a reduction in power consumption, but comes at the expense of a reduced retention time. In a device including STT-RAM, for example, the retention time may be reduced from years to minutes or seconds, for example, in which case implementing the present technique may also be appropriate.

It will be appreciated that while in the example shown in FIG. 1 the apparatus comprises a single memory controller 108 configured to communicate with both DRAMs, in other examples the apparatus 10 may comprises two independent memory controllers, each configured to communicate with one of the DRAMs.

In an exemplary modification of the apparatus 10 of FIG. 1, the DRAMs may be dual in-line memory modules (DIMMs) in two different channels with a separate memory controller each.

In another exemplary modification of the apparatus 10 of FIG. 1, the apparatus may include a DRAM with reduced refresh. The DRAM with reduced refresh may be included in addition to, or as a replacement for, the DRAM without refresh 114 and performs refresh operations at a frequency less than the minimum refresh frequency. For example, in one arrangement the DRAM with reduced refresh may refresh at a rate varied based on an error rate. For example, the apparatus may also include error detection circuitry configured to detect a number of errors that occur in the DRAM with reduced refresh over time, and the DRAM with reduced refresh may be arranged to perform refresh operations at a frequency to maintain the error rate at (or below) a predetermined threshold. The refresh frequency can be increased when the error rate is above the threshold, and decreased when the error rate is below the threshold.

Compilers (static or dynamic) can perform liveness analysis on data variables to detect temporal variables which won't need to survive longer than the DIMM refresh cycle of 64 or 32 ms for example. Such data variables may include short lived stack variables in non-recursive functions, or heap objects that are known to be short lived for example. The compiler can detect such data variables and place them in the non-refresh DIMM. Furthermore, compilers can take the target processor information by the '-mtune' option in gcc for example. That is it is possible to work out the number of cycles a data variable is live, with target processor information and frequency specification or run time frequency information. Thus it is possible to work out the lifespan of the data variable in ms, then place the data variable in the non-refresh DIMM if the lifespan is shorter than the DIMM refresh cycle. Another example which managed languages, such as generational copying garbage collectors can place young generations in the non-refresh DIMM, as most objects die young, only copying surviving objects to the normal DRAM. However, it is assumed that no interrupts, exception conditions, or context switches occur between the lifetime of a variable. The context can be saved to the normal DIMM if such a scenario is faced.

Figure 2:
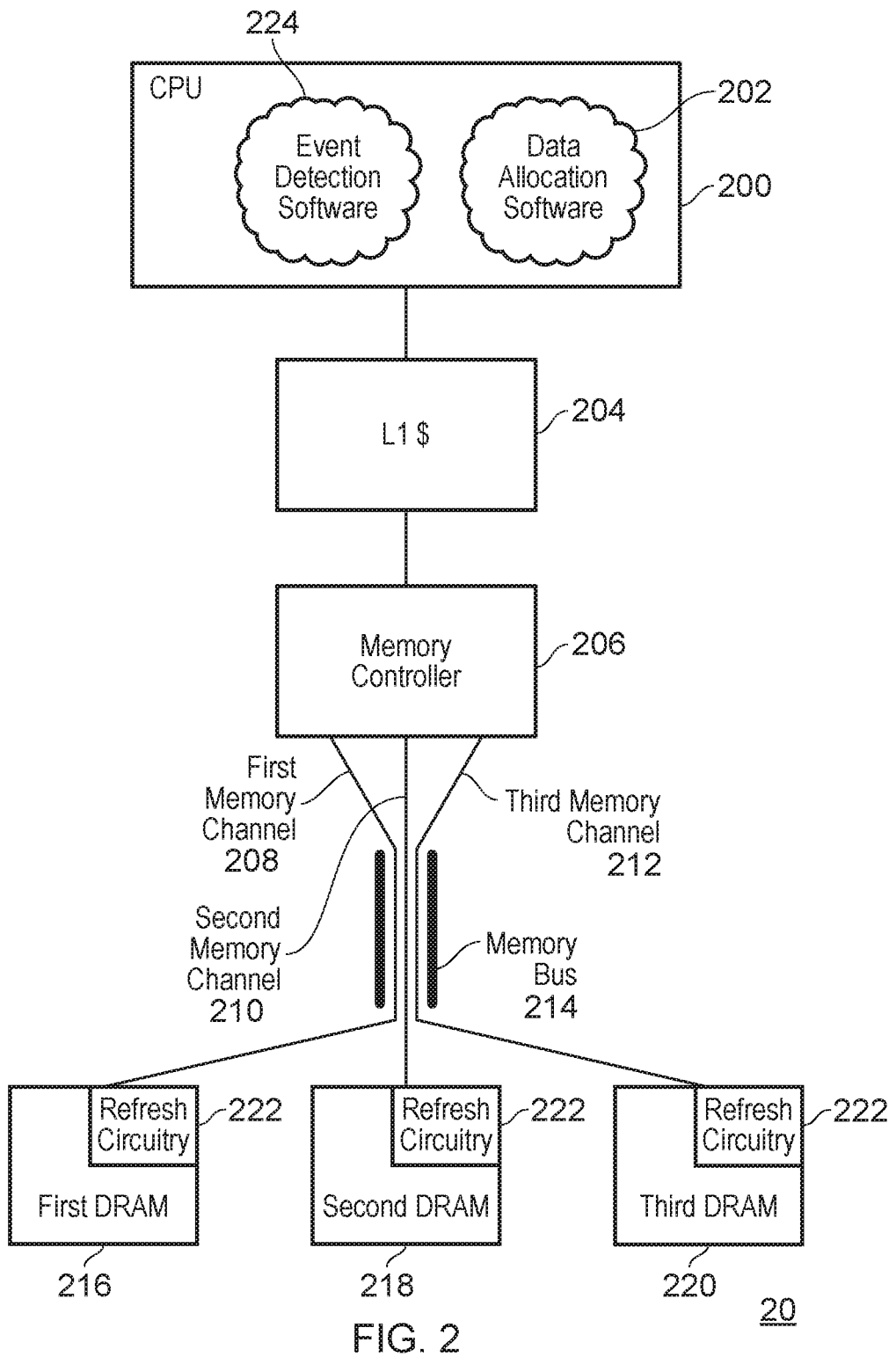
FIG. 2 shows another example of an apparatus according to the present technique.

FIG. 2 shows another apparatus 20 according to the present technique. The apparatus comprises CPU 200, a level 1 cache (L1$) 204, a memory controller 206, first DRAM 216, second DRAM 218 and third DRAM 220. Each DRAM of the apparatus 20 comprises refresh circuitry 222 configured to perform refresh operations for its respective DRAM. The first DRAM 216 of the apparatus 20 is configured in the same manner as the DRAM without refresh 114 of FIG. 1, and thus does not perform refresh operations on stored data. This may be achieved by an inhibit refresh signal transmitted from the memory controller 206 to the first DRAM 216 for example. The second DRAM 218 of the apparatus 20 is configured in the same manner as the DRAM 116 of FIG. 1, and does perform refresh operations on stored data in order to retain stored data beyond the predetermined period. Thus the refresh circuitry 222 of the second DRAM 218 is configured to perform refresh operations by reading out data stored in the second DRAM 218 and rewriting this data at a rate roughly equivalent to the minimum refresh frequency.

The memory controller 206 is coupled to the DRAMs via a single bus 214. However, within the bus 214 there are three separate memory channels 208, 210 and 212, via which the memory controller can independently address each of the DRAMs. For example, the memory controller is configured to transmit separate signals to each DRAM in parallel from the memory controller 206. Each of the separate signals can be distinct.

The CPU 200 is configured to execute data allocation software 202. The data allocation software 202 analyses data that is to be written to memory by the CPU 200, the memory comprising the first, second and third DRAMs. If the data allocation software 202 determines that valid data to be written to memory is not expected to be required for proper processing at a point in time beyond the predetermined period then the valid data is allocated to the first DRAM 216. For example, if the apparatus 20 will not require data after the predetermined period, or if the apparatus 20 can tolerate the loss of data after the predetermined period, such data may be allocated to the first DRAM 216. On the other hand, if the data allocation software 202 determines that data is going to be required for proper processing at a point in time beyond the predetermined period then the valid data is allocated to the second DRAM 218. The data allocation software 202 may refer to a storage location that stores a mapping of addresses to the first and second memory regions in order to allocate data to the appropriate memory region.

The data allocation software 202 operates on the assumption that processing of the CPU will continue in a streamlined fashion, and will complete current tasks before beginning new tasks. However, in some systems this is not always the case. Therefore, the CPU 200 is also configured to execute event detection software 224. The event detection software 224 detects the occurrence of events such as exception conditions, interrupts and context switches. In response to such events the CPU 200 will stop a current task, and switch to another task as indicated by the particular event. Therefore, when such an event occurs the initial determination of where to allocate data made by the data allocation software 202 may no longer be correct, because this determination was made on the assumption that the CPU would complete the current task before performing another task. Therefore, in response to detection of such an event, the event detection software 224 is configured to initiate saving of at least some of the data stored in the first DRAM 216 to the second DRAM 218. Therefore, when processing returns to the original task such data will still be available to the CPU 200. Alternatively, a hardware detection mechanism could be provided to detect exceptions, interrupts or context switches and in response trigger saving of a subset of the data from the first DRAM region to the second DRAM region 218 (or the third DRAM region 220).

The apparatus 10 further comprises a third DRAM 220. The refresh circuitry 222 of the third DRAM 220 is configured to refresh the third DRAM 220 at a frequency greater than the minimum refresh frequency. The third DRAM 200 may be used to store data that is considered more critical or more secure. For example, the retention time of DRAMs is temperature dependent, and when the temperature surrounding the DRAMs increases, the predetermined period for which the DRAMs can store data in the absence of a refresh operation may decrease and some cells of the DRAM may begin to leak data. Therefore, the CPU 200 is arranged to store critical data in the third DRAM 220 where the chances of poor retention due to a temperature increase are reduced. The third DRAM 220 is also less sensitive to malicious activities such as row hammer attacks, and is thus also a suitable location for secure data.

While FIGS. 1 and 2 show the respective DRAM regions as separate DRAM units, it would also be possible to implement the first/second/third memory regions as different sub-regions of a single memory unit. For example, separate memory controllers could be provided on the different memory channels for generating separate sequences of refresh commands/addresses directed to the respective sub-regions of the single memory unit, so that one sub-region is refreshed at a different frequency to the other (or if the refresh frequency is zero for the first memory region than no refresh addresses may be generated at all for that region).

Figure 3:
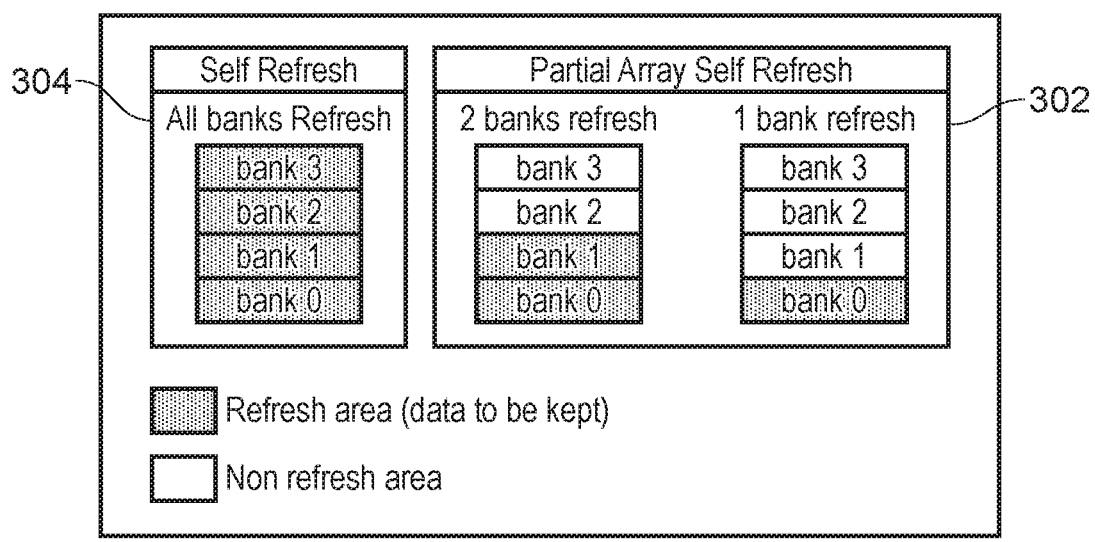
FIG. 3 shows an example of a partial array self refresh mechanism.

FIG. 3 shows an example of a partial array self refresh scheme, which provides a further reduction to power consumption. In the partial array self refresh scheme, refresh operations are only performed for occupied regions of a memory region 302. For example, in the memory region 302 of FIG. 3 only bank 0 and bank 1 of the left column of a memory region and bank 0 of the right column of a memory region are occupied. Therefore, according to the partial array self refresh scheme, refresh operations are only performed for these banks, whilst being omitted for bank 2 and bank 3 of the left column, and banks 1 to 3 of the right column. This contrasts to the self refresh scheme implemented in memory region 304 where all banks are refreshed regardless of which banks store data. The partial array self refresh scheme is suitable for implementation in the DRAM 116 of FIG. 1, or the DRAMs 218 and 220 of FIG. 2 for example. On the other hand, for the first memory region 114, 216, refresh operations are omitted for regions storing valid data, not just regions storing invalid data.

Figure 4:
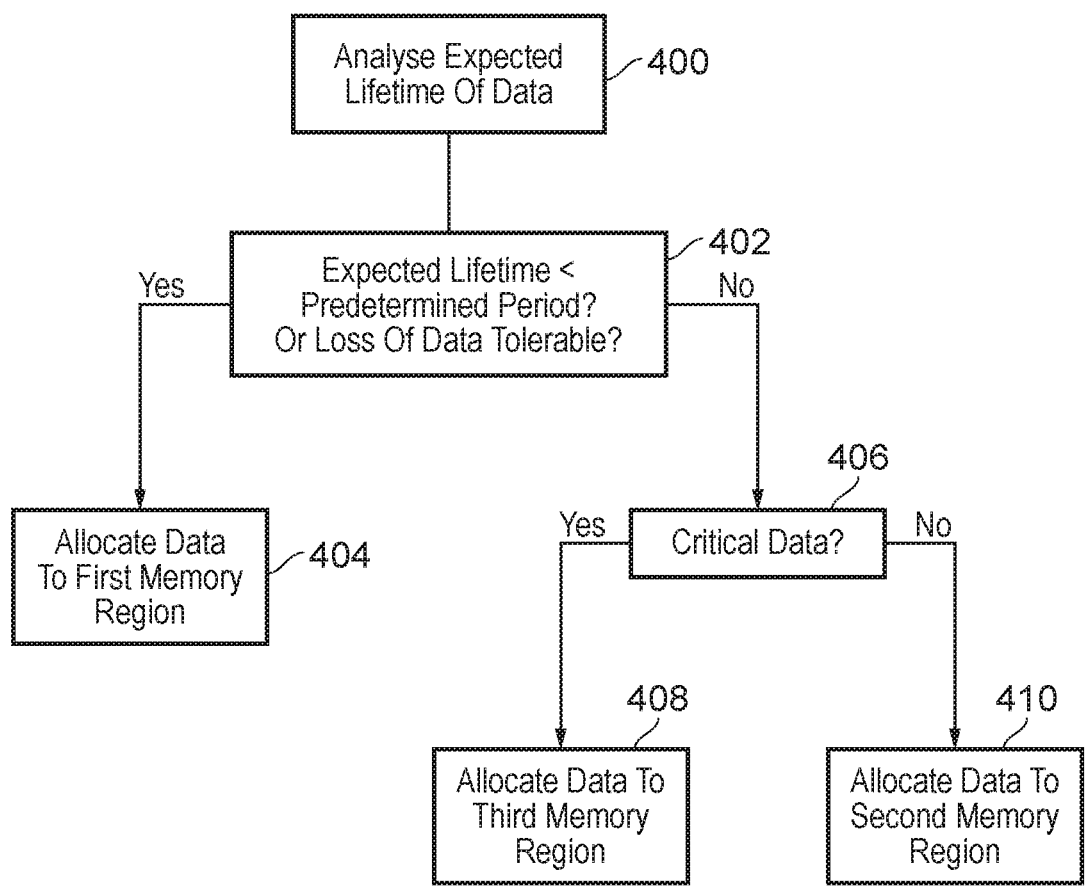
FIG. 4 shows a method for allocating data to memory regions according to the present technique.

FIG. 4 shows a method of allocating data to memory regions according to the present technique. The method is appropriate for the data allocation software 202 shown in the apparatus of FIG. 2 for example. In step 400 the process analyses the expected lifetime of data to be stored to a memory. The expected lifetime analysed in step 400 is representative of how long data may be required for proper processing of a data processing apparatus to continue. For example, data may have its expected lifetime determined based on the point at which an apparatus will no longer require that data. For example, data which is updated at a given rate (e.g. a frame of graphics data in a frame buffer which is updated at a frequency corresponding to the screen refresh rate of a display) can be considered to have an expected lifetime corresponding to the period between successive updates, e.g. if a display refresh frequency is greater than the minimum refresh frequency of the memory, the contents of the frame buffer could be considered suitable for storing in the non-refresh memory region 114.

In step 402, it is determined whether the expected lifetime is less than the predetermined period corresponding to the amount of time data can be safely stored in a first memory region when that memory region is refreshed at a refresh frequency less than its minimum refresh frequency. If the expected lifetime of data is less than this predetermined period, or loss of the data could be tolerated, then the data may be allocated to the first memory region as shown in step 404. Data loss may sometimes be tolerated even if its expected lifetime is greater than the predetermined period. For example data elements that constitute randomised algorithms or fault tolerant channel coding algorithms may be required by an apparatus at a later stage, but since proper processing can continue in the absence of such data, it is safe to store such data in the first memory region.

If the expected lifetime of data is not less than the predetermined period, and loss of the data cannot be tolerated, the process then determines whether the data is critical data in step 406. Critical data may be considered data that is of high importance for proper processing to proceed, or secure data. If the data is secure data, then it may be allocated to a third memory region that is refreshed at a refresh frequency greater than its minimum refresh frequency, as shown in step 408. Alternatively, if the data is not secure data, then it may be allocated to a second memory region that is refreshed roughly at its minimum refresh frequency as shown in step 410.

Steps 406 and 408 of the method of FIG. 4 are optional, and instead all data that has an expected lifetime that is equal to or greater than the predetermined period may be allocated to the second memory region. For example, this may be used in embodiments which do not have a third memory region.

Figure 5:
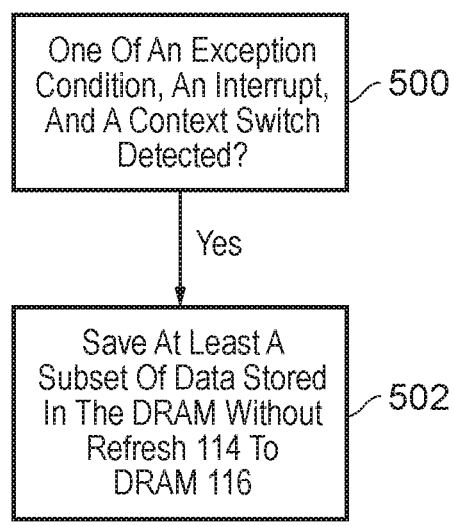
FIG. 5 shows a method for migrating data in response to an event according to the present technique.

FIG. 5 shows a method of saving data when an event that disrupts processing of the apparatus 10 occurs. In step 500 the process detects whether one of an exception condition, an interrupt and a context switch occurs. These events will cause processing to switch from a current task to another task. The expected lifetime of data stored in DRAM without refresh 114 is based on the assumption that processing of the current task will be allowed to complete without interruption. However, switching processing to another task in response to one of these events disrupts processing of the current task, and as such this assumption cannot be maintained. Therefore, in response to detecting an event in step 500, in step 502 at least a subset of data stored in the DRAM without refresh 114 is migrated to DRAM 116. In some cases, not all of the data stored in DRAM without refresh 114 needs to be migrated. For example, data that may have been allocated to the DRAM without refresh 114 on the basis that its loss could be tolerated, so this data may not need to be saved in response to the interrupt, exception or context switch. However, data that was allocated to the DRAM without refresh 114 on the basis that the apparatus would not require the data for proper processing after the predetermined period may be migrated to the DRAM 116 in step 502.

In some examples a memory controller may be configured to store selected data having an expected lifetime shorter than the predetermined period in the first memory region. Furthermore, the selected data comprises data updated at a frequency greater than the minimum refresh frequency. Furthermore, the selected data comprises data for which a period between storing the data to memory and a final read of the data is less than the predetermined period.

In some examples, a method comprises selecting one of first and second address regions of a memory address space in dependence on an expected lifetime of selected data to be stored to memory and a data retention period of said memory; and associating the selected data with an address in the selected one of the first and second address regions.

Furthermore, the first address region may be selected when the estimated lifetime is less than a threshold based on the data retention period, and the second address region is selected when the estimated lifetime is greater than or equal to the threshold.

Furthermore, the estimated lifetime may comprise a period of time from storing the selected data in the memory until one of: a final read of the selected data from the memory, and the selected data being overwritten in the memory.

Furthermore, the memory may use a data storage technology for which retention of data for longer than the data retention time is dependent on a refresh operation for refreshing data being performed at a frequency that is greater than or equal to a minimum refresh frequency, the first address region corresponds to a region of the memory to be refreshed at a first frequency lower than the minimum refresh frequency, and the second address region corresponds to a region of the memory to be refreshed at a frequency greater than or equal to the minimum refresh frequency.

Furthermore, the method may be performed by a compiler compiling program instructions to be executed by a target processor. Hence, a compiler may allocate data values to the first or second region depending on the expected lifetime of the data.

Furthermore, the estimated lifetime of the selected data may be determined in dependence on target processor information indicative of at least one performance property of the target processor. Different processors may for example operate at different clock frequencies or issue different numbers of instructions per cycle, which may effect the expected lifetime between data being written in response to one instruction and being read in response to another instruction. Hence, the compiler or other code selecting whether to allocate data to the first/second address region could determine the estimated lifetime in dependence on target processor information indicating a property of the target processor on which the code is to be executed.

Furthermore, the method may comprise mapping an estimated number of processing cycles corresponding to the estimated lifetime to a time duration corresponding to the estimated lifetime in dependence on the target processor information.

Furthermore, the method may be performed by software executed by processing circuitry in an apparatus comprising the memory. Hence, rather than performing the allocation of data to the first/second memory region at compile time, it could be done at runtime by software executing on the same apparatus that comprises the first/second memory regions.

Furthermore, the estimated lifetime of selected data may be determined in dependence on information provided by a garbage collection algorithm. Garbage collection algorithms may track the lifetime of data in terms of how many garbage collection cycles (generations) data persists for, so information gathered by the garbage collection algorithm can be useful for determining whether to allocate data to the first or second memory region.

Furthermore, the estimated lifetime may be determined in dependence on monitoring of the lifetime of the selected data in previous processing operations.

Furthermore, the method may be performed by hardware in an apparatus comprising the memory.

Another example comprises a computer program comprising instructions for controlling a data processing apparatus to perform the above method.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments have been described in detail herein with reference to the accompanying drawings, it is to be understood that the invention is not limited to those precise embodiments, and that various changes and modifications can be effected therein by one skilled in the art without departing from the scope of the appended claims.

I claim:

1. An apparatus comprising:
   first and second memory regions each to store data using a data storage technology for which retention of data for longer than a predetermined period of time is dependent on a refresh operation for refreshing data in the memory region being performed at a frequency that is greater than or equal to a minimum refresh frequency; and
   at least one controller to control storage of data in the first memory region with the refresh operation performed at a first frequency lower than said minimum refresh frequency when valid data is stored in the first memory region, and to control storage of data in the second memory region with the refresh operation performed at a second frequency that is greater than or equal to said minimum refresh frequency when valid data is stored in the second memory region,
   wherein in a time period in which the refresh operation is performed at said first frequency for said first memory region valid data remains stored in the first memory region;
   wherein said at least one controller is configured to communicate with the first memory region with the refresh operation performed at the first frequency lower than said minimum refresh frequency when valid data is stored in the first memory region via a first memory channel and with the second memory region with the refresh operation performed at the second frequency that is greater than or equal to said minimum refresh frequency when valid data is stored in the second memory region via a second memory channel separate from the first memory channel, so that the memory regions refreshed at different refresh frequencies are on different memory channels.

2. The apparatus according to claim 1, wherein said first frequency is zero.

3. The apparatus according to claim 1, comprising circuitry configured to trigger saving of at least a subset of data stored in said first memory region to said second memory region in response to one of an exception condition, an interrupt, and a context switch.

4. The apparatus according to claim 1, wherein said at least one controller comprises:
   a first controller configured to communicate with the first memory region via the first memory channel to control storage of data in the first memory region with the refresh operation performed at the first frequency; and
   a second controller configured to communicate with the second memory region via the second memory channel to control storage of data in the second memory region with the refresh operation performed at said second frequency.

5. The apparatus according to claim 1, wherein said at least one controller is configured to provide a sequence of refresh addresses for controlling performance of said refresh operation on said second memory region.

6. The apparatus according to claim 1, wherein a memory unit comprising said first memory region comprises refresh circuitry configured to perform said refresh operation,
   wherein said at least one controller is configured to control said refresh circuitry to perform said refresh operation at said first frequency for said first memory region.

7. The apparatus according to claim 1, wherein said at least one controller is configured to identify occupied regions within said second memory region, and control whether said refresh operation is performed on said second memory region in dependence on whether the second memory region comprises any occupied regions.

8. The apparatus according to claim 7, wherein said at least one controller is configured to omit performance of said refresh operation for unoccupied regions in said second memory region.

9. The apparatus according to claim 1, comprising a third memory region to store data using said data storage technology;
   wherein said at least one controller is configured to control storage of data in the third memory region with the refresh operation performed at a third frequency greater than said second frequency.

10. The apparatus according to claim 1, wherein said data storage technology comprises DRAM.

11. The apparatus according to claim 1, wherein said first and second memory regions comprise separate memory units.

12. The apparatus according to claim 1, wherein said first and second memory regions comprise separate dual in-line memory modules (DIMMs).

13. The apparatus according to claim 1, wherein said first frequency is variable in dependence on an error rate detected for valid data stored in the first memory region.

14. A method for an apparatus comprising first and second memory regions each to store data using a data storage technology for which retention of data for longer than a predetermined period of time is dependent on a refresh operation for refreshing data in the memory region being performed at a frequency that is greater than or equal to a minimum refresh frequency, said method comprising:
   performing the refresh operation for the first memory region at a first frequency lower than said minimum refresh frequency when valid data is stored in the first memory region, and
   performing the refresh operation for the second memory region at a second frequency that is greater than or equal to said minimum refresh frequency when valid data is stored in the second memory region, wherein in a time period in which the refresh operation is performed at said first frequency for said first memory region valid data remains stored in the first memory region;

wherein at least one controller for controlling storage of data in the first and second memory regions communicates with the first memory region with the refresh operation performed at the first frequency lower than said minimum refresh frequency when valid data is stored in the first memory region via a first memory channel and with the second memory region with the refresh operation performed at the second frequency that is greater than or equal to said minimum refresh frequency when valid data is stored in the second memory region via a second memory channel separate from the first memory channel, so that the memory regions refreshed at different refresh frequencies are on different memory channels.

15. The method according to claim 14, wherein in response to one of an exception condition, an interrupt, and a context switch, data stored in said first memory region is saved to said second memory region.

16. A non-transitory storage medium storing a computer program comprising instructions for controlling a data processing apparatus to perform the method of claim 14.

17. An apparatus comprising:

first and second memory regions each to store data using a data storage technology for which retention of data for longer than a predetermined period of time is dependent on a refresh operation for refreshing data in the memory region being performed at a frequency that is greater than or equal to a minimum refresh frequency;

at least one controller to control storage of data in the first memory region with the refresh operation performed at a first frequency lower than said minimum refresh frequency when valid data is stored in the first memory region, and to control storage of data in the second memory region with the refresh operation performed at a second frequency that is greater than or equal to said minimum refresh frequency when valid data is stored in the second memory region, wherein in a time period in which the refresh operation is performed at said first frequency for said first memory region valid data remains stored in the first memory region; and circuitry configured to trigger saving of at least a subset of data stored in said first memory region to said second memory region in response to an event causing suspension or disruption of a current task, said event comprising one of an exception condition, an interrupt, and a context switch.

* * * * *